(12) United States Patent
You et al.

(10) Patent No.: US 11,854,657 B2
(45) Date of Patent: Dec. 26, 2023

(54) MEMORY DEVICE AND MEMORY SYSTEM SUPPORTING INTERLEAVING OPERATION AND OPERATION METHOD THEREOF

(71) Applicant: SK hynix Inc., Gyeonggi-do (KR)

(72) Inventors: Tae Hee You, Gyeonggi-do (KR); Beom Ju Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/671,043

(22) Filed: Feb. 14, 2022

(65) Prior Publication Data
US 2023/0070958 A1 Mar. 9, 2023

(30) Foreign Application Priority Data
Sep. 8, 2021 (KR) .......... 10-2021-0119498

(51) Int. Cl.
*G11C 7/10* (2006.01)
(52) U.S. Cl.
CPC .......... *G11C 7/1063* (2013.01); *G11C 7/1057* (2013.01); *G11C 7/1069* (2013.01); *G11C 7/1084* (2013.01); *G11C 7/1096* (2013.01)
(58) Field of Classification Search
CPC ..... G11C 7/1006; G11C 7/1063; G06F 12/06; G06F 12/0607; G06F 13/16; G06F 13/1647; G06F 13/1673
See application file for complete search history.

(56) References Cited

U.S. PATENT DOCUMENTS

| | | | |
|---|---|---|---|
| 9,003,102 B2 * | 4/2015 | Lassa | G06F 3/061 711/103 |
| 9,959,078 B2 * | 5/2018 | Shah | G06F 3/0688 |
| 10,114,690 B2 * | 10/2018 | Shah | G06F 11/0793 |
| 10,453,548 B2 * | 10/2019 | Chu | G06F 11/3034 |
| 10,658,046 B2 | 5/2020 | Chang et al. | |
| 2012/0179883 A1 | 7/2012 | Ma | |
| 2022/0011959 A1 * | 1/2022 | Srinivasan | G06F 13/1668 |
| 2022/0188025 A1 * | 6/2022 | Tanpairoj | G06F 3/0604 |

OTHER PUBLICATIONS 1.8V, 8G-bit NAND Flash Memory MX60UF8G18AC, May 28, 2019, p. 1-80, REV. 1.0, Macronix International Co., Ltd.

* cited by examiner

*Primary Examiner* — Son L Mai
(74) *Attorney, Agent, or Firm* — IP & T GROUP LLP

(57) ABSTRACT

A memory system includes at least one memory die and a controller coupled to the at least one memory die via a data path. The at least one memory die includes plural memory planes and a register storing operation statuses and operation results regarding the respective memory planes. The controller transfers a first status check command to the at least one memory die and receives a first response including the operation statuses and the operation results regarding the respective memory planes.

17 Claims, 9 Drawing Sheets

FIG. 6

| Status Check CMD | SR[0] | SR[1] | SR[2] | SR[3] | SR[4] | SR[5] | SR[6] | SR[7] | Comment |
|---|---|---|---|---|---|---|---|---|---|
| | Pass/Fail (Current Page) | Pass/Fail (Previous Page) | - | - | - | Ready/Busy (Internal) | Ready/Busy (External) | Write Protect | STATUS OF SPECIFIC PLANE |
| Related Mode | PGM/Erase | Cache PGM | | | | Cache PGM/Read | PGM/Erase/Read | | |

FIG. 8

| Status Check CMD | SR[0] | SR[1] | SR[2] | SR[3] | SR[4] | SR[5] | SR[6] | SR[7] | Comment |
|---|---|---|---|---|---|---|---|---|---|
| | Pass/Fail (Plane0) | Pass/Fail (Plane1) | Pass/Fail (Plane2) | Pass/Fail (Plane3) | Ready/Busy (Plane0) | Ready/Busy (Plane1) | Ready/Busy (Plane2) | Ready/Busy (Plane3) | STATUSES OF ALL PLANES |
| Related Mode | PGM/Erase | PGM/Erase | PGM/Erase | PGM/Erase | PGM/Erase/Read | Cache PGM/Read | PGM/Erase/Read | PGM/Erase/Read | |

MEMORY DEVICE AND MEMORY SYSTEM SUPPORTING INTERLEAVING OPERATION AND OPERATION METHOD THEREOF

CROSS-REFERENCE TO RELATED APPLICATIONS

This patent application claims the benefit of Korean Patent Application No. 10-2021-0119498, filed on Sep. 8, 2021, the entire disclosure of which is incorporated herein by reference.

TECHNICAL FIELD

One or more embodiments of the present disclosure described herein relate to a memory device, a memory system, and an operation method thereof, and more particularly, to an apparatus and method for an interleaving operation in the memory device and the memory system.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

FIG. 6 illustrates a first response corresponding to a status check command according to embodiments of the present disclosure.

FIG. 8 illustrates a second response corresponding to the status check command according to embodiments of the present disclosure.

DETAILED DESCRIPTION

Figure 1:
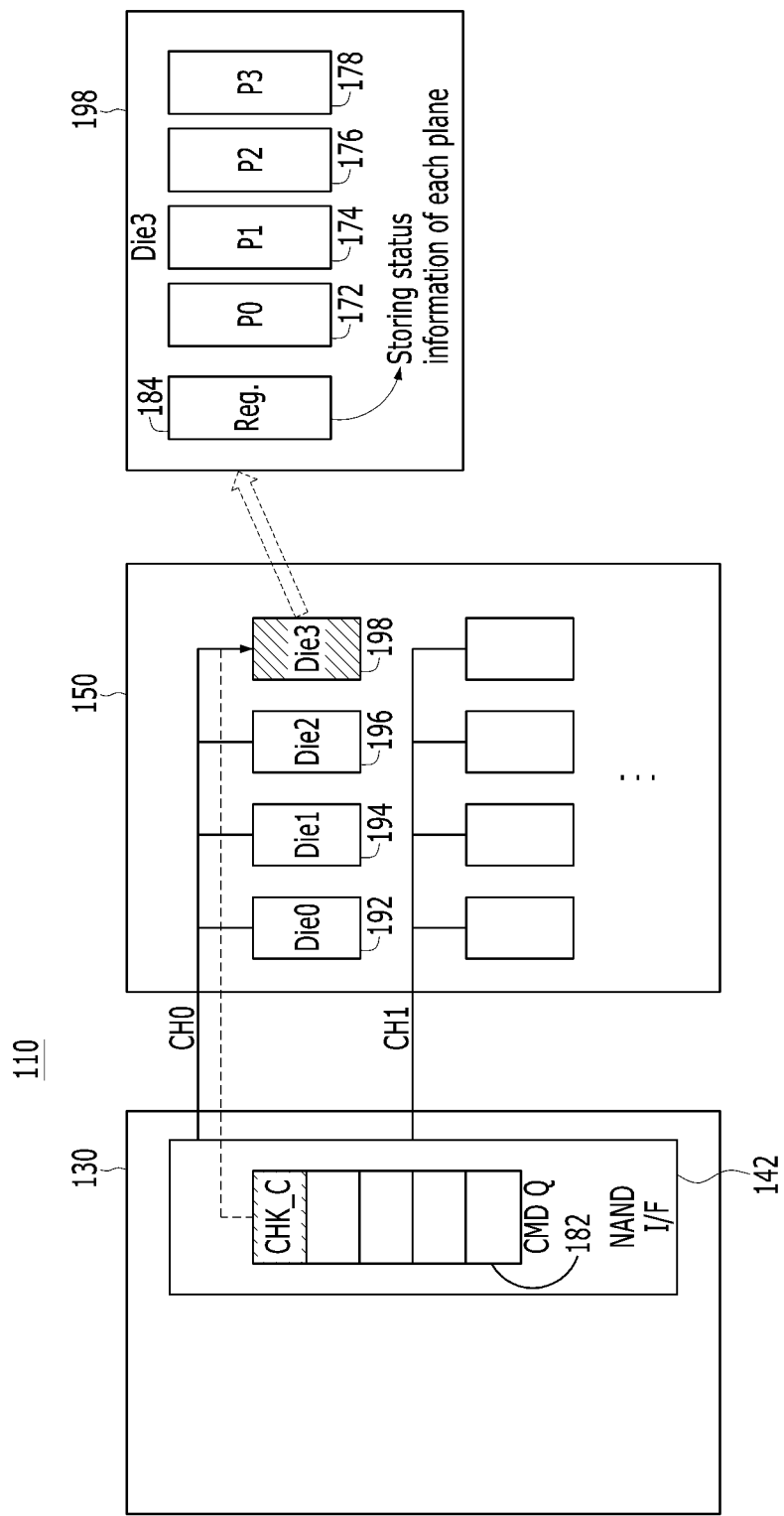
FIG. 1 illustrates a memory system according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components, e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during an operation. As such, the block/unit/circuit/component can be said to be configured to perform the task even when the specified block/unit/circuit/component is not currently operational, e.g., is not turned on nor activated. The block/unit/circuit/component used with the "configured to" language include hardware for example, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software, to operate in manner that is capable of performing the task(s) at issue. "Configured to" may also include adapting a manufacturing process, e.g., a semiconductor fabrication facility, to fabricate devices, e.g., integrated circuits, that are adapted to implement or perform one or more tasks.

As used in the disclosure, the term 'circuitry' or 'logic' refers to all of the following: (a) hardware-only circuit implementations such as implementations in only analog and/or digital circuitry, and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor or multiple processors or a portion of a processor and its or their accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering, e.g., spatial, temporal, logical, etc. The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments of the present disclosure described herein provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure may provide a memory system, a data processing system, and an operation process or a method, which may quickly and reliably process data into a memory device by reducing operational complexity and performance degradation of the memory system, thereby enhancing usage efficiency of the memory device.

In addition, an embodiment of the present disclosure can provide a memory system including at least one memory die including a plurality of memory planes supporting an interleaving mode and a controller for controlling data input/output operations, performed in the plurality of planes, in the interleaving mode. The memory die including a plurality of memory cells capable of storing data in the memory system may include the plurality of memory planes, and the controller can perform data input/output operations in parallel in a memory plane unit to improve data input/output performance of the memory system.

In an embodiment, a memory system can include at least one memory die including plural memory planes and a register storing operation statuses and operation results regarding the respective memory planes; and a controller coupled to the at least one memory die via a data path and configured to transfer a first status check command to the at least one memory die and receive a first response including the operation statuses and the operation results regarding the respective memory planes.

The first status check command can include an address indicating a memory die of the at least one memory die.

The operation statuses can show whether each memory plane of the plural memory planes is busy or ready for a first operation. The first operation can include one of a program operation, an erase operation, and a read operation.

The operation results can show whether a second operation performed within each memory plane of the plural memory planes is a success or failure. The second operation can include one of a program operation and an erase operation.

The first response can have a size of 1 byte. In the 1 byte of the first response, each 2 bits are assigned to each memory plane of the plural memory planes. The 2 bits can include a first bit showing the operation state of a corresponding memory plane and a second bit showing the operation result of the corresponding memory plane.

The controller can be configured to: divide a third operation into unit operations be performed within the respective memory planes; transfer one of the unit operations to a first memory plane among the plural memory planes when it is determined based on the first response that the first memory plane is ready; and transfer a second status check command to the at least one memory die when a completion regarding the transferred unit operation is transferred from any of the plural memory planes.

The controller can be configured to transfer another unit operation of the unit operations to a second memory plane among the plural memory planes when it is determined based on a second response corresponding to the second status check command that the second memory plane is ready.

Each memory plane among the plural memory planes can include plural memory blocks and a data input/output buffer to individually perform a data input/output operation. The register can store the operation statuses indicating whether each memory plane of the plural memory planes is busy or ready and the operation results indicating whether an operation performed within each memory plane of the plural memory planes has succeeded or failed.

In an embodiment, a memory die can include plural memory planes including plural non-volatile memory cells capable of storing data; a register storing operation statuses and operation results regarding the respective memory planes; and a control circuit configured to receive a status check command, collect the operation statuses and the operation results stored in the register, and output the collected operation statuses and operation results as a response corresponding to the status check command.

The response can include plural first bits showing the operation statuses regarding the respective memory planes and plural second bits showing the operation results regarding the respective memory planes.

The memory die can further include plural data input/output pins configured to transfer the status check command and the response; and an enable pin configured to receive a chip enable signal delivered from an external device. The chip enable signal can be activated before the status check command is received via the plural data input/output pins, and before the response is transferred via the plural data input/output pins.

A length of the response can be an integer multiple of a number of the plural data input/output pins.

The response can be outputted bit by bit through the plural data input/output pins.

In another embodiment, a method for operating a memory system can include transmitting a first status check command to at least one memory die through a data path; receiving, from the at least one memory die, a first response including operation statuses and operation results of all memory planes included in the at least one memory die, in response to the first status check command; and transmitting a command for a data input/output operation to a plane included in the at least one memory die, in response to the first response.

The method can further include storing the operation statuses and the operation results of the respective memory planes, included in the at least one memory die, in a register.

The first status check command can include an address indicating a memory die of the at least one memory die.

The method can further include activating a chip enable signal before receiving or transferring the status check command and the response via plural data input/output pins.

The operation statuses can show whether each memory plane of the plural memory planes is busy or ready for a first operation. The first operation can include one of a program operation, an erase operation, and a read operation.

The operation results can show whether a second operation performed within each memory plane of the plural memory planes has succeeded or failed. The second operation can include one of a program operation and an erase operation.

The first response can have a size of 1 byte. In the 1 byte of the first response, each 2 bits are assigned to each memory plane of the plural memory planes. The 2 bits can include a first bit showing the operation status of a corresponding memory plane and a second bit showing the operation result of the corresponding memory plane.

In another embodiment, an operating method of a memory device can include gathering, whenever ending a latest operation on each of planes within a die, first information representing success or fail of the latest operation; gathering, in response to a command from an external device, second information representing a currently busy or standby status of each of the planes; and providing, upon completion of the gathering of the second information, the external device with the first and second information via a single message transferred between the memory device and the external device.

Embodiments of the present disclosure will now be described with reference to the accompanying drawings, wherein like numbers reference like elements.

FIG. 1 illustrates a memory system according to an embodiment of the present disclosure.

Referring to FIG. 1, the memory system 110 can include a controller 130 and a memory device 150. The memory device 150 can include a plurality of non-volatile memory cells capable of storing data transmitted from an external device, e.g., a host 102 shown in FIG. 2. The memory device 150 can output stored data upon a request from the host 102. The controller 130 can control data input/output operations performed within the memory device 150 and perform data communication with the host 102.

According to an embodiment, the memory device 150 and the controller 130 in the memory system 110 can be physically separated components. The memory device 150 and the controller 130 may be connected through at least one data path. For example, the data path can include plural channels CH0, CH1 and plural ways W0, W1, W2, W3, and the like.

According to an embodiment, the memory device 150 and the controller 130 can be functionally separated components. Further, according to an embodiment, the memory device 150 and the controller 130 can be implemented through a single semiconductor chip or a plurality of semiconductor chips. For example, the memory device 150 may include a plurality of memory dies 192, 194, 196, 198, each memory die implemented as a memory chip. The plurality of memory dies 192, 194, 196, 198, can be understood as a set of components implemented on a physically distinguishable substrate. The plurality of memory dies 192, 194, 196, 198 can share one channel CH0 for data communication with the controller 130. The memory system 110 capable of storing massive or voluminous data can include a plurality of memory dies 192, 194, 196, 198 coupled to the controller 130 through a plurality of channels CH0, CH1. In addition, each of the memory dies 192, 194, 196, 198 can include an interface circuit for exchanging data, signals, and the like with the controller 130.

According to an embodiment, the memory die 192, 194, 196, 198 can include at least one memory plane individually. For example, a fourth memory die 198 can include four memory planes P0 to P3, 172, 174, 176, 178. According to an embodiment, the memory plane P0 to P3 can include at least one memory block 152, 154, 156 (refer to FIG. 2). According to an embodiment, the memory plane P0 to P3 may be considered a logical or a physical partition including a driving circuit capable of controlling an array of a plurality of non-volatile memory cells, and a buffer that can temporarily store data input to, or output from, non-volatile memory cells.

Each of the memory planes 172, 174, 176, 178 can include a plurality of memory blocks 152, 154, 156. The memory blocks 152, 154, 156 can be understood as a group of non-volatile memory cells from which data is removed together through an erase operation. Further, the memory block 152, 154, 156 can include a page. The page can be understood as a group of non-volatile memory cells that store data together during a program operation or output data together during a read operation. For example, the memory block 152, 154, 156 can include a plurality of pages.

According to an embodiment, the memory device 150 may include at least one memory block 152, 154, 156, at least one memory plane 172, 174, 176, 178, or at least one memory die 192, 194, 196, 198. An internal configuration of the memory device 150 described with reference to FIG. 1 can be changed in response to designed operation performance of the memory system 110. An embodiment of the present disclosure is not limited to the internal configuration described with reference to FIG. 1.

To improve operation performance of data input/output for storing and outputting voluminous data, the memory system 110 should quickly process a plurality of data input/output operations. When the plurality of data input/output operations are performed in parallel, first data can be programmed to, or read from, a non-volatile memory cell group while second data can be programmed to, or read from, another non-volatile memory cell group. In this case, even if plural non-volatile memory cell groups share a data path, the controller or each of the plural non-volatile memory cell groups alternatively uses the data path so that data collision could be avoided. In an embodiment of the present disclosure, each of the memory planes 172, 174, 176, 178 included in the memory dies 192, 194, 196, 198 can individually and independently perform data input/output operations. Referring to FIG. 1, 16 memory planes included in four memory dies 192, 194, 196, 198 can independently perform data input/output operations, and can transmit and receive data through a shared channel CH0. An operation speed of transmitting and receiving data between the controller 130 and the memory die 192, 194, 196, 198 is faster than that of programming, reading, or deleting data to, from, or in the non-volatile memory cells in each of the memory planes 172, 174, 176, 178. Because data transmission operation through the shared channel can be performed very quickly, a plurality of memory dies or a plurality of memory planes can share a single channel. Sharing a channel can improve an integration degree of the memory system 110.

To improve performance of the data input/output operation of the memory system 110, the memory system 110 can support a plane interleaving way to perform plural input/output operations within the plurality of memory planes 172, 174, 176, 178 in parallel. In order to improve the performance of the data input/output operation of the memory system 110 through the plane interleaving way, it could be important how to control or schedule the plural input/output operations within the plurality of memory planes 172, 174, 176, 178.

In order to perform data input/output operations in parallel in a memory plane unit, the controller 130 can check operation states and operation results regarding the plurality of memory planes 172, 174, 176, 178. For example, the controller 130 can transfer a command for collecting information regarding the plurality of planes 172, 174, 176, 178 to the memory dies 192, 194, 196, 198. In response to the command, the memory dies 192, 194, 196, 198 can transfer a response including the information regarding the plurality of memory planes 172, 174, 176, 178 to the controller 130. Each of the memory dies 192, 194, 196, 198 can include a register 184 for storing the operation states and the operation results regarding the plurality of memory planes 172, 174, 176, 178 included therein. If the controller 130 transmits a command, the memory dies 192, 194, 196, 198 could transfer to the controller 130, the operation states and operation results regarding all of the memory planes 172, 174, 176, 178, which are collected and stored in the register 184.

Referring to FIG. 1, the memory interface (NAND I/F) 142 in the controller 130 can control data communication between the controller 130 and the memory device 150. The memory interface 142 can include a command queue (CMD Q) 182. Commands or information associated with various operations to be performed in the memory device 150 can be sequentially stored in the command queue 182. According to an embodiment, the memory interface 142 can include a plurality of command queues 182. For example, the memory interface 142 may include a number of command queues 182 based on the number of memory dies 192, 194, 196, 198 or the number of memory planes 172, 174, 176, 178. If there are four memory dies, the memory interface 142 could include four command queues. Each command queue might be assigned to each memory die.

For example, the command queue 182 can include a status check command CHK_C. The status check command CHK_C can be dequeued from the command queue 182 and delivered to the fourth memory die 198. The fourth memory die 198 can transfer a response including information stored in the register 184, that is, the operation states and operation results regarding all memory planes 172, 174, 176, 178, in response to the status check command CHK_C input from the controller 130. Hereinafter, it is described how to transmit and receive the status check command CHK_C and the response corresponding thereto between the controller 130 and the at least one memory die 198, how to organize the response, e.g., a data structure of the response, and how to improve performance of the memory system 110 based on the response.

According to an embodiment, the status check command CHK_C can include an address indicating a specific memory die among plural memory dies 192, 194, 196, 198 included in the memory system 110. When plural memory dies share the channel CH0, CH1, the controller 130 can use the address indicating the memory die to select one of the memory dies sharing the channel.

Hereinafter, descriptions will be made focusing on operations or components that can be technically distinguished between the controller 130 and the memory device 150 described in FIG. 1 and FIGS. 2 to 4. Specifically, a flash translation layer (FTL) 240 in the controller 130 will be described in more detail with reference to FIGS. 3 to 4. According to an embodiment, roles and functions of the flash translation layer (FTL) in the controller 130 may be varied.

Figure 2:
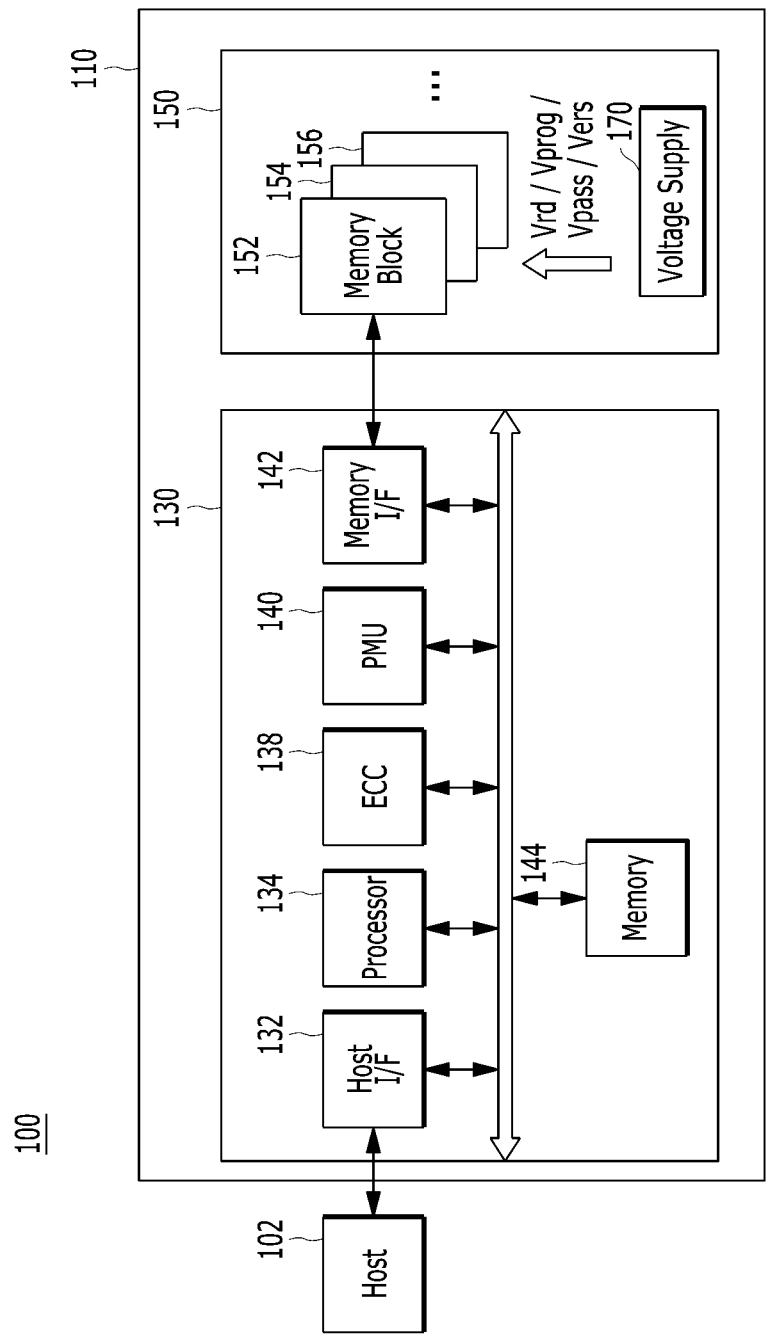
FIG. 2 illustrates a data processing system according to another embodiment of the present disclosure.
Figure 3:
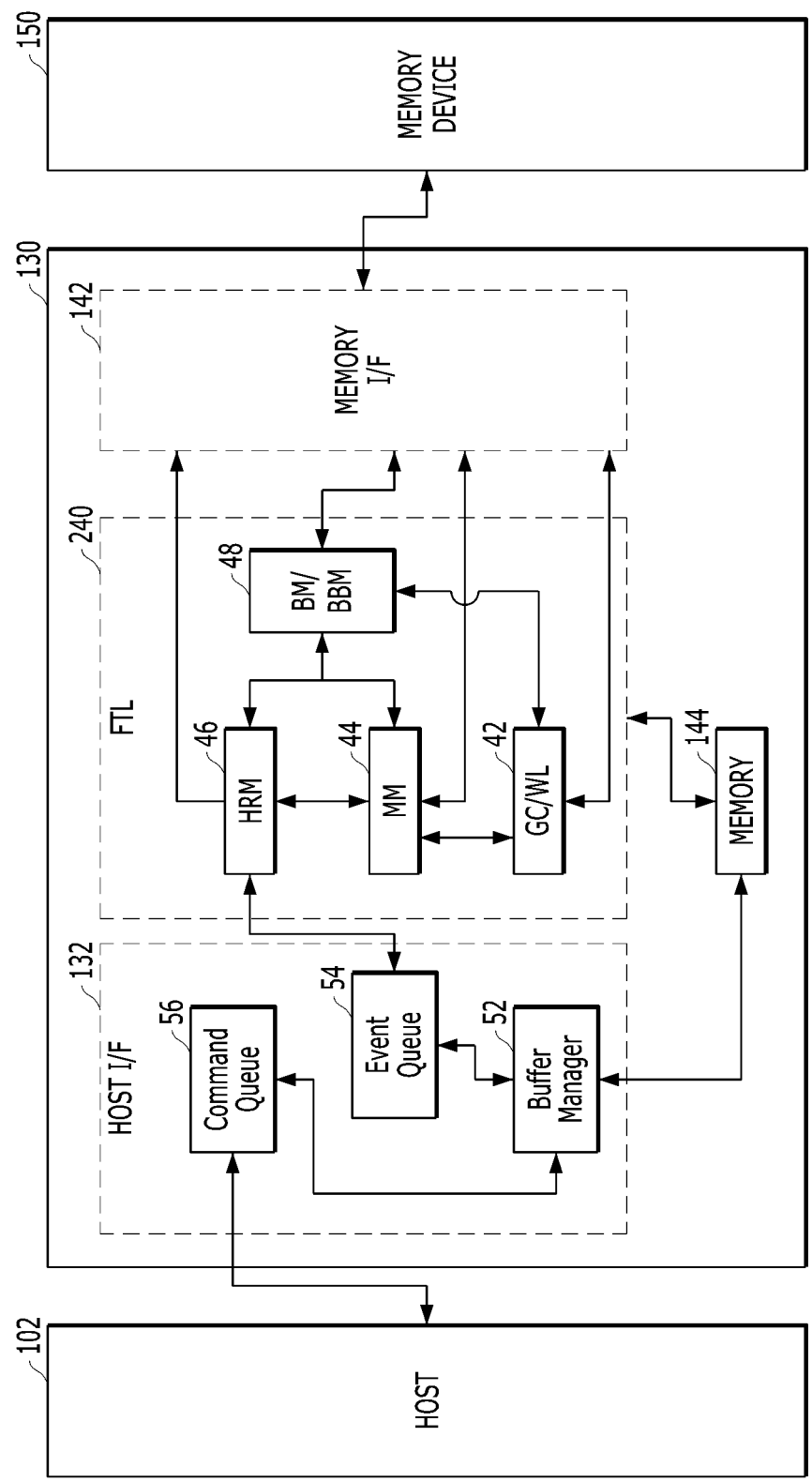
FIG. 3 illustrates a memory system according to another embodiment of the present disclosure.

FIGS. 2 and 3 illustrate some operations that may be performed by the memory system 110 according to one or more embodiments of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIGS. 1 and 2 may be different according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device, e.g., a mobile phone, an MP3 player, a laptop computer, etc., or a non-portable electronic device, e.g., a desktop computer, a game player, a television, a projector, etc.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation or a program operation to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands or requests, and/or data input from the host 102 via a bus. For example, the host 102 and the memory system 110 may use a predetermined set of rules or procedures for data communication or a preset interface to transmit and receive data therebetween. Examples of sets of rules or procedures for data communication or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by firmware called a host interface layer (HIL). According to an embodiment, the host interface 132 can include a command queue.

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device, e.g., memory system 110 are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device, e.g., host 102, and a peripheral device, e.g., memory system 110. For example, the PCIe can use a plurality of pins, e.g., 18 pins, 32 pins, 49 pins, or 82 pins, and at least one wire, e.g., x1, x4, x8, or x16, to achieve high speed data communication over several hundred MB per second, e.g., 250 MB/s, 500 MB/s, 984.6250 MB/s, or 1969 MB/s. According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal, e.g., a correction success signal or a correction fail signal, based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of the components included in the controller 130 shown in FIG. 1.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150. The memory interface 142 can include the command queue 182 shown in FIG. 1.

According to an embodiment, the memory interface 142 may support an open NAND flash interface (ONFi), a toggle mode, or the like, for data input/output with the memory device 150. For example, the ONFi may use a data path, e.g., a channel, a way, etc. that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information, e.g., map data, read requests, program requests, etc. used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed or performance of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. As a background operation that is performed without a command transmitted from the host 102, the controller 130 can perform garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102, e.g., Manual GC the garbage collection can be considered a foreground operation. When the memory system 110 performs garbage collection independently of the host 102, e.g., Auto GC, the garbage collection can be considered a background operation.

When the memory device 150 includes a plurality of dies or a plurality of chips each including a plurality of non-volatile memory cells, the controller 130 may perform parallel processing regarding plural requests or commands input from the host 102 in order to improve performance of the memory system 110. For example, the transmitted requests or commands may be divided into plural groups based on which one among a plurality of planes, a plurality of dies, or a plurality of chips included in the memory device 150 the transmitted requests or commands could be performed within, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels or ways associated with the plurality of dies included in the memory device 150. The controller 130 may determine a status of each channel or each way as one of a busy status, a ready status, an active status, an idle status, a normal status, and an abnormal status. The determination of which channel or way an instruction and/or a data is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In an embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data, e.g., two or more bits of data. The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as an SLC buffer to temporarily store data because the buffer may require a high data input/output speed for improving performance of the memory system 110.

Further, according to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Referring to FIG. 3, the controller 130 in a memory system operates along with the host 102 and the memory device 150. As illustrated, the controller 130 includes the host interface 132, a flash translation layer (FTL) 240, the memory interface 142, and the memory 144 previously identified with reference to FIG. 2.

According to an embodiment, the error correction circuitry 138 illustrated in FIG. 2 may be included in the flash translation layer (FTL) 240. In another embodiment, the error correction circuitry 138 may be implemented as a separate module, a circuit, firmware, or the like, which is included in or associated with the controller 130.

The host interface 132 may handle commands, data, and the like transmitted from the host 102. By way of example but not limitation, the host interface 132 may include a command queue 56, a buffer manager 52, and an event queue 54. The command queue 56 may sequentially store the commands, the data, and the like received from the host 102, and output them to the buffer manager 52, for example, in an order in which they are stored in the command queue 56. The buffer manager 52 may classify, manage, or adjust the commands, the data, and the like received from the command queue 56. The event queue 54 may sequentially transmit events for processing the commands, the data, and the like received from the buffer manager 52.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or a command for reading data, i.e., a read command, and a command for programming/writing data, i.e., a write command, may be alternately transmitted to the memory system 110. The host interface 132 may sequentially store commands, data, and the like, which are transmitted from the host 102, in the command queue 56. Thereafter, the host interface 132 may estimate or predict what type of internal operations the controller 130 will perform according to the characteristics of the commands, the data, and the like, which have been transmitted from the host 102. The host interface 132 may determine a processing order and a priority of commands, data and the like based on their characteristics.

According to the characteristics of the commands, the data, and the like transmitted from the host 102, the buffer manager 52 in the host interface 132 is configured to determine whether the buffer manager 52 should store the commands, the data, and the like in the memory 144, or whether the buffer manager 52 should deliver the commands, the data, and the like to the flash translation layer (FTL) 240. The event queue 54 receives events, transmitted from the buffer manager 52, which are to be internally executed and processed by the memory system 110 or the controller 130 in response to the commands, the data, and the like, and delivers the events to the flash translation layer (FTL) 240 in the order of the events input to the event queue 54.

In accordance with an embodiment, the flash translation layer (FTL) 240 illustrated in FIG. 3 may implement a multi-thread scheme to perform data input/output (I/O) operations. A multi-thread FTL may be implemented through a multi-core processor using multi-thread included in the controller 130.

In accordance with an embodiment, the flash translation layer (FTL) 240 may include a host request manager (HRM) 46, a map manager (MM) 44, a state manager 42, and a block manager 48. The host request manager (HRM) 46 may manage the events transmitted from the event queue 54. The map manager (MM) 44 may handle or control map data. The state manager 42 may perform garbage collection (GC) or wear leveling (WL). The block manager 48 may execute commands or instructions onto a block in the memory device 150.

By way of example but not limitation, the host request manager (HRM) 46 may use the map manager (MM) 44 and the block manager 48 to handle or process requests according to read and program commands and events which are delivered from the host interface 132.

The host request manager (HRM) 46 may send an inquiry request to the map manager (MM) 44 to determine a physical address corresponding to a logical address which is entered with the events. The host request manager (HRM) 46 may send a read request with the physical address to the memory interface 142 to process the read request, i.e., handle the events. In an embodiment, the host request manager (HRM) 46 may send a program request or a write request to the block manager 48 to program data to a specific empty page storing no data in the memory device 150, and then may transmit a map update request corresponding to the program request to the map manager (MM) 44 in order to update an item relevant to the programmed data in information of mapping the logical and physical addresses to each other.

The block manager 48 may convert a program request delivered from the host request manager (HRM) 46, the map manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of a multi-channel and multi-directional flash controller.

In an embodiment, the block manager 48 may manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move valid data stored in the selected block to an empty block and erase data stored in the selected block so that the memory device 150 may have enough free blocks, i.e., empty blocks with no data. When the block manager 48 provides information regarding a block to be erased to the state manager 42, the state manager 42 may check all flash pages of the block to be erased to determine whether each page of the block is valid.

For example, to determine validity of each page, the state manager 42 may identify a logical address recorded in an out-of-band (00B) area of each page. To determine whether each page is valid, the state manager 42 may compare a physical address of the page with a physical address mapped to a logical address obtained from an inquiry request. The state manager 42 sends a program request to the block manager 48 for each valid page. A map table may be updated by the map manager 44 when a program operation is complete.

The map manager 44 may manage map data, e.g., a logical-physical map table. The map manager 44 may process various requests, for example, queries, updates, and the like, which are generated by the host request manager (HRM) 46 or the state manager 42. The map manager 44 may store the entire map table in the memory device 150, e.g., a flash/non-volatile memory, and cache mapping entries according to the storage capacity of the memory 144. When a map cache miss occurs while processing inquiry or update requests, the map manager 44 may send a read request to the memory interface 142 to load a relevant map table stored in the memory device 150. When the number of dirty cache blocks in the map manager 44 exceeds a certain threshold value, a program request may be sent to the block manager 48, so that a clean cache block is made and a dirty map table may be stored in the memory device 150.

When garbage collection is performed, the state manager 42 copies valid page(s) into a free block, and the host request manager (HRM) 46 may program the latest version of the data for the same logical address of the page and currently issue an update request. When the state manager 42 requests the map update in a state in which the copying of the valid page(s) is not completed normally, the map manager 44 might not perform the map table update. This is because the map request is issued with old physical information when the state manger 42 requests a map update and a valid page copy is completed later. The map manager 44 may perform a map update operation to ensure accuracy when, or only if, the latest map table still points to the old physical address.

Figure 4:
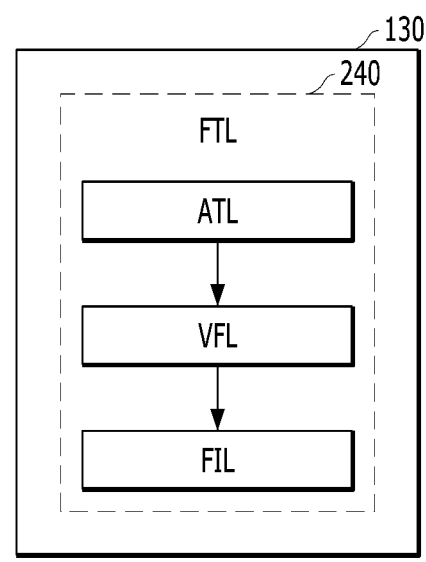
FIG. 4 illustrates an internal configuration included in a controller shown in FIGS. 1 to 3 according to embodiments of the present disclosure.

FIG. 4 illustrates internal configuration of the controller shown in FIGS. 1 to 3 according to an embodiment of the present disclosure.

Referring to FIG. 4, the flash translation layer (FTL) 240 in the controller 130 can be divided into three layers: an address translation layer ATL; a virtual flash layer VFL; and a flash Interface Layer FIL.

For example, the address translation layer ATL may convert a logical address LA transmitted from a file system into a logical page address. The address translation layer ATL can perform an address translation process regarding a logical address space. That is, the address translation layer ATL can perform an address translation process based on mapping information to which the logical page address LPA of the flash memory 140 is mapped to the logical address LA transmitted from the host. Such logical-to-logical address mapping information hereinafter referred to as L2L mapping, may be stored in an area in which metadata is stored in the memory device 150.

The virtual flash layer VFL may convert the logical page address LPA, which is mapped by the address translation layer ATL, into a virtual page address VPA. Here, the virtual page address VPA may correspond to a physical address of a virtual memory device. That is, the virtual page address VPA may correspond to the memory block 60 in the memory device 150. If there is a bad block among the memory blocks 60 in the memory device 150, the bad block may be excluded by the virtual flash layer VFL. In addition, the virtual flash layer VFL can include a recovery algorithm for scanning a scan area to restore the logical-to-virtual address mapping information (L2V mapping) stored in the memory device 150 and mapping information in the data region for storing user data. The recovery algorithm can be capable of recovering the logical-to-virtual address mapping information (L2V mapping). The virtual flash layer VFL may perform an address conversion process regarding the virtual address space, based on the logical-to-virtual address mapping information (L2V mapping) restored through the recovery algorithm.

The flash interface layer FIL can convert a virtual page address of the virtual flash layer VFL into a physical page address of the memory device 150. The flash interface layer FIL performs a low-level operation for interfacing with the memory device 150. For example, the flash interface layer FIL can include a low-level driver for controlling hardware of the memory device 150, an error correction code (ECC) for checking and correcting an error in data transmitted from the memory device 150, and a module for performing operations such as Bad Block Management (BBM).

Figure 5:
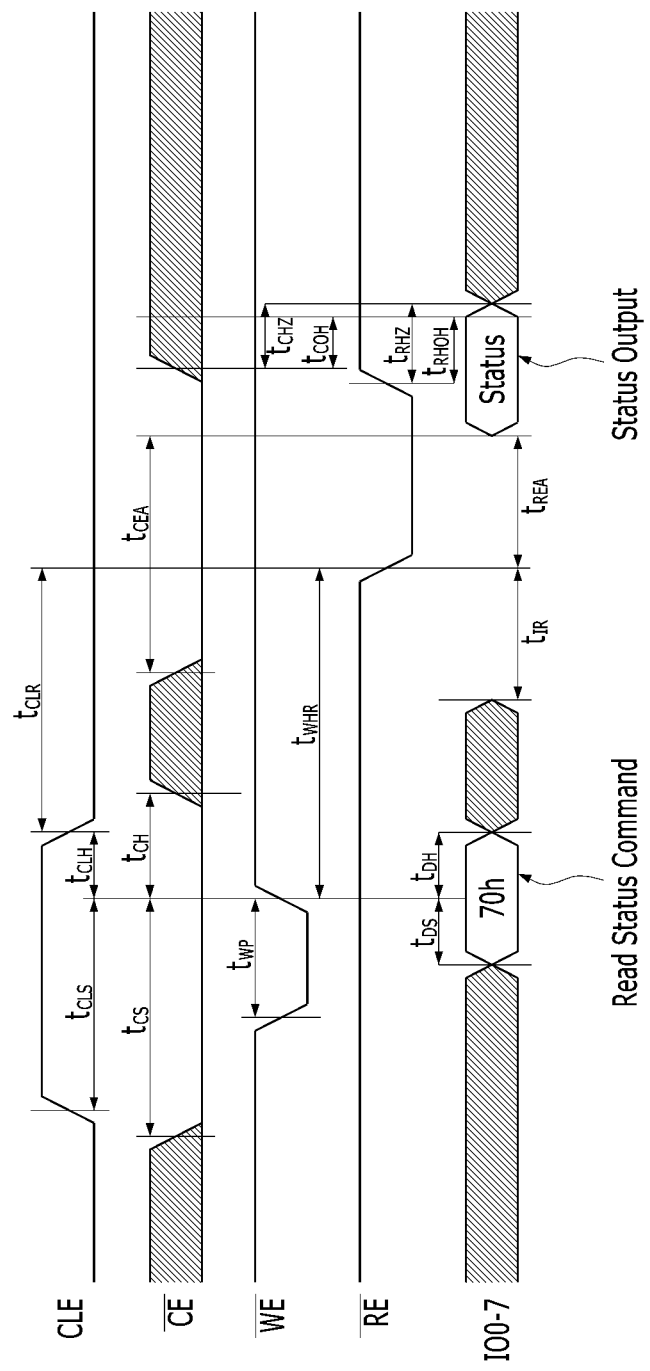
FIG. 5 illustrates an operation timing for confirming an operation status and an operation result of planes included in a memory system according to embodiments of the present disclosure.

FIG. 5 illustrates an operation timing for confirming an operation state and an operation result of planes included in a memory system according to an embodiment of the present disclosure. Specifically, FIG. 5 shows an example of internal operation performed between the controller 130 and the fourth memory die 198 among the plurality of memory dies 192, 194, 196, 198. The internal operation can include a data communication process for transferring a status check command, e.g., Read Status Command, 70h, and a response, e.g., Status Output, corresponding to the status check command.

Referring to FIG. 5, the controller 130 can activate a chip enable signal (Chip enable, CE #) connected to the fourth memory die 198 to transmit and receive data, commands, or information to and from the fourth memory die 198. According to an embodiment, in FIG. 5, the chip enable signal CE # can be activated at a logic low level and deactivated at a logic high level. For example, when the controller 130 transmits a command to the fourth memory die 198 or receives a response from the fourth memory die 198, the chip enable signal (Chip enable, CE #) can be activated as long as a command latch enable signal setup time (CLE setup time, $t_{CLS}$) and a command latch enable signal hold time (CLE hold time, $t_{CLH}$).

After the chip enable signal CE # is activated, the controller 130 can activate a command latch enable signal CLE. The command latch enable signal (Command latch enable, CLE) can be used by the controller 130 to transmit a command to the fourth memory die 198 and used by the fourth memory die 198 to receive the command transmitted from the controller 130. The command latch enable signal CLE can be activated to a logic high level for as long as the command latch enable signal setup time (CLE setup time, $t_{CLS}$) and the command latch enable signal hold time (CLE hold time, $t_{CLH}$). According to an embodiment, the command latch enable signal setup time (CLE setup time, $t_{CLS}$) and the command latch enable signal hold time (CLE hold time, $t_{CLH}$) may have different activation times.

The controller 130 can activate a write enable signal WE #, which may be generated based on a clock signal CLK, as a logic low level. The write enable signal WE # is activated by a preset pulse width (WE # pulse width, $t_{WP}$) of the write enable signal. The write enable signal WE # can be activated when the controller 130 transmits a command, data, etc. to the fourth memory die 198. On the other hand, when the fourth memory die 198 transmits data, a completion notification, status information, etc. to the controller 130, a read enable signal RE # that can be generated based on a write enable signal WE # can be activated as a logic low level.

When the command latch enable signal CLE and the write enable signal WE # are activated, the controller 130 controls data input/output channel I/O[7:0] to transmit the status check command 70h to the fourth memory die 198. According to an embodiment, the status check command 70h can have a length of one byte. In the data input/output channel I/O[7:0]), a value corresponding to the status check command 70h can be maintained during a data hold time $t_{DH}$ and a data setup time $t_{DS}$. During the data hold time $t_{DH}$ and the data setup time $t_{DS}$, the fourth memory die 198 can receive a status check command 70h.

After providing a sufficient operation margin for the fourth memory die 198 to receive the status check command 70h, the controller 130 can disable the chip enable signal CE #. After a preset time passes or elapses, the controller 130 can activate the chip enable signal CE # again. The chip enable signal CE # can be deactivated and then reactivated to clearly separate transmission and reception of commands and data between the controller 130 and the fourth memory die 198.

After a delay time (CLE to RE # delay, $t_{CLR}$) from a timing of disabling the command latch enable signal to a timing of enabling a read enable signal RE # is disabled and a time (WE # high to RE # low, $t_{WHR}$) from a timing of disabling the write enable signal WE # to the timing of enabling the read enable signal RE #, the controller 130 can activate the read enable signal RE # as a logic low level. During a read enable signal access time $t_{REA}$, the fourth memory die 198 can recognize that the read enable signal RE # is activated, and output a response (Status Output) corresponding to the status check command 70h, which has been received, via the data input/output channel I/O[7:0]. In order that the controller 130 does not have any difficulty in receiving the response (Status Output) output by the fourth memory die 198, the fourth memory die 198 can maintain the response via the data input/output channel I/O[7:0] until a time (RE # high to output hold, $t_{RHOH}$) of holding the output after deactivation of the read enable signal RE # and a time (RE # high to output hi-Z, $t_{RHZ}$) of outputting a high impedance state after deactivation of the read enable signal RE # are satisfied. In addition, the fourth memory die 198 can hold the response (Status Output) via the data input/output channel I/O [7:0] until a time (CE # high to output hold, $t_{COH}$) of holding the response (Status Output) after the chip enable signal CE # is deactivated and a time (CE # high to output hi-Z, $t_{CHZ}$) of outputting the high impedance state after the chip enable signal CE # is deactivated are satisfied. As described above, the controller 130 can receive the operation states and the operation results regarding all of memory planes in the fourth memory die 198, without an error through an operation margin or an operation window) established to transmit and receive the status check command 70h and the response (Status Output).

FIG. 6 illustrates a first response corresponding to a status check command according to an embodiment of the present disclosure.

Referring to FIG. 6, a first response output by the memory dies 192, 194, 196, 198 in response to a status check command transmitted by the controller 130 can have a size of 1 byte, that is, 8 bits. A first bit SR[0] of the first response can show whether an operation performed on a current page in a memory plane succeeds or fails. Herein, an example of the operation performed on the current page can be a program operation or an erase operation. For example, if the first bit SR[0] is '0', the first response can indicate that the operation performed on the current page has succeeded. If the first bit SR[0] is '1', the first response can indicate that the operation performed on the current page has failed.

A second bit SR[1] of the first response can indicate whether a cache program operation (Cache PGM) associated with a previous page succeeds/fails. A third bit SR[2] to a fifth bit SR[4] of the first response may not be used or might be reserved.

A sixth bit SR[5] of the first response can indicate whether a cache program operation, a cache read operation, a program of another page, a block erase, or a read operation are being performed, e.g., busy. For example, if the sixth bit SR[5] is '0', the memory plane may be in a busy status. But, if the sixth bit SR[5] is '1', the memory plane may be in a ready status for a next operation. In fact, the sixth bit SR[5] can be '0' while the program operation is being performed. But, the sixth bit SR[5] can be changed to '1' when an internal operation is terminated during the cache mode.

A seventh bit SR[6] of the first response can indicate whether a page program operation, a block erase operation, a cache program operation, a read operation, or a cache read operation are being performed. For example, if the seventh bit SR[6] is '0', the memory plane may be in a busy status. If the seventh bit SR[6] is '1', the memory plane may be in a ready status for a next operation. The seventh bit SR[6] can be '1' if an internal cache can store new data. According to an embodiment, the seventh bit SR[6] can be the same as a value transferred via a pin that outputs the operation state (Ready/Busy) of the memory dies 192, 194, 196, 198 to the controller 130.

An eighth bit SR[7] of the first response can relate to write protection. If the eighth bit SR[7] is '0', the write protection is indicated. If the eighth bit SR[7] is '1', the first response can indicate unprotected.

Referring to FIG. 6, even when the plurality of memory planes 172, 174, 176, 178 are included in the memory dies 192, 194, 196, 198, the first response can have a data structure suitable for outputting the operation statuses and the operation results regarding a single memory plane among the plurality of memory planes 172, 174, 176, 178.

Figure 7:
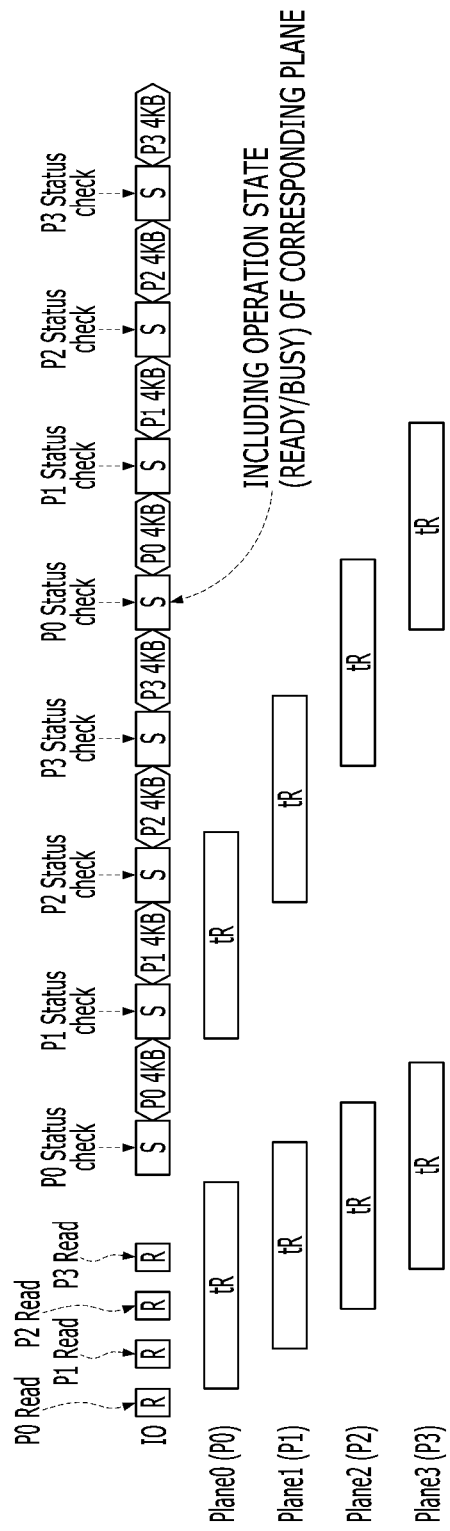
FIG. 7 illustrates a data input/output operation performed by the memory system in an interleaving mode based on the first response described with reference to FIG. 6 according to embodiments of the present disclosure.

FIG. 7 illustrates a data input/output operation performed by the memory system in an interleaving mode based on the first response described with reference to FIG. 6. FIG. 7 illustrates an example in which an interleaving operation is performed on four planes P0 to P3 in the fourth memory die 198.

Referring to FIGS. 1 and 7, each of the memory planes P0 to P3 may support an interleaving mode capable of independently and individually performing a data input/output operation. Read operations, even if individually performed within different planes in response to read commands, could have a substantially same operation margin (tR). In response to previous read commands, read operations might have been performed within each of the memory planes P0 to P3. However, each of the memory planes P0 to P3 in the fourth memory die 198 shares a data path, e.g., a channel. For example, the controller 130 may sequentially generate read commands (P0 Read, P1 Read, P2 Read, P3 Read) for reading data respectively stored in each of the memory planes P0 to P3. The controller 130 can check whether each of the memory planes P0 to P3 are ready for a read operation or, which memory plane the read operation can be performed within among the respective memory planes P0 to P3. Because each memory plane P0 to P3 shares one data path, the controller 130 can transfer status check commands (P0 Status check, P1 Status check, P2 Status check, P3 Status check) to check the operation status of each memory plane P0 to P3 before transferring the read commands (P0 Read, P1 Read, P2 Read, P3 Read) into each memory plane P0 to P3 through a shared data path.

Referring to FIG. 6, a response corresponding to the status check command can include an operation status and an operation result regarding a single memory plane. Therefore, to obtain information regarding all of the plural memory planes P0 to P3, the controller 130 should transmit the plural status check commands (P0 Status check, P1 Status check, P2 Status check, P3 Status check), and the fourth Memory die 198 could transfer plural responses to controller 130. Each response can correspond to each of the plural status check commands (P0 Status check, P1 Status check, P2 Status check, P3 Status check).

Referring to FIG. 7, if it is determined that a read operation can be performed within a first memory plane P0 based on information regarding the first memory plane P0, the controller 130 can transfer a read command to the memory plane P0. After performing the read operation tR, the first memory plane P0 can output data to the controller 130. While the read operation is being performed on the first memory plane P0, the controller 130 can check information regarding the second memory plane P1 and transmit a read command to the second memory plane P1 when the second memory plane P1 is ready. The second memory plane P1 can output data to the controller 130 after performing a read operation in response to the read command. Because the controller 130 checks the operation status regarding each of the plurality of memory planes P0 to P3 and transfers a read command, an overlapped section between the operation margins tR for the read operations performed within different memory planes can be reduced. This can indicate that the memory system 110 may individually and independently perform read operations in each of the memory planes P0 to P3, but a degree of parallel processing becomes lowered. This method might have a limitation in enhancing or improving the data input/output performance of the memory system 110.

FIG. 8 illustrates a second response corresponding to the status check command. Herein, regarding the second response, a case in which four memory planes are included in a single memory die is described as an example. If the number of memory planes included in the single memory die increases, a size or a length of the second response can increase. Further, the length of the second response may vary according to a type of information included in the second response. For example, the second response can have a length of 1 byte, 2 bytes, or 3 bytes.

Referring to FIG. 8, the second response output by each of the memory dies 192, 194, 196, 198 in response to a status check command transferred from the controller 130 is described as an example of 1 byte length, that is, a size of 8 bits. A first bit SR[0] of the second response may indicate whether an operation performed within the first memory plane P0 of a selected memory die among the memory dies 192, 194, 196, 198 has succeeded or failed. Herein, an example of the operation performed in the first memory plane P0 can include a program operation and an erase operation. For example, if the first bit SR[0] is '0', the second response indicates that the operation performed in the first plane P0 has succeeded. If the first bit SR[0] is '1', the second response indicates that the operation performed in the first plane P0 has failed. Similarly, a second bit SR[1], a third bit SR[2] and a fourth bit SR[3] in the second response can indicate success/failure of operations which have performed in a second memory plane P1, a third memory plane P2 and a fourth memory plane P3 of the selected memory die.

A fifth bit SR[4] of the second response may indicate whether the first memory plane P0 is performing an operation. For example, the fifth bit SR[4] could be '0' if a program operation, an erase operation, or a read operation is being performed in the first memory plane P0. The fifth bit SR[4] could be '1' if being in a standby status that is, in a ready status. Similarly, the sixth bit SR[5], the seventh bit SR[6], and the eighth bit SR[7] of the second response can indicate whether an operation is being performed within each of the second plane P1, the third plane P2, and the fourth plane P3.

As described above, the second response individually output from each of the memory dies 192, 194, 196, 198 can include an operation status (busy/ready) and an operation result (Pass/Fail) of each of memory planes in each of the memory dies 192, 194, 196, 198. In response to the status check command transmitted by the controller 130, each of the memory dies 192, 194, 196, 198 can construct a second response based on information stored in the register 184 and output the second response to the controller 130.

Figure 9:
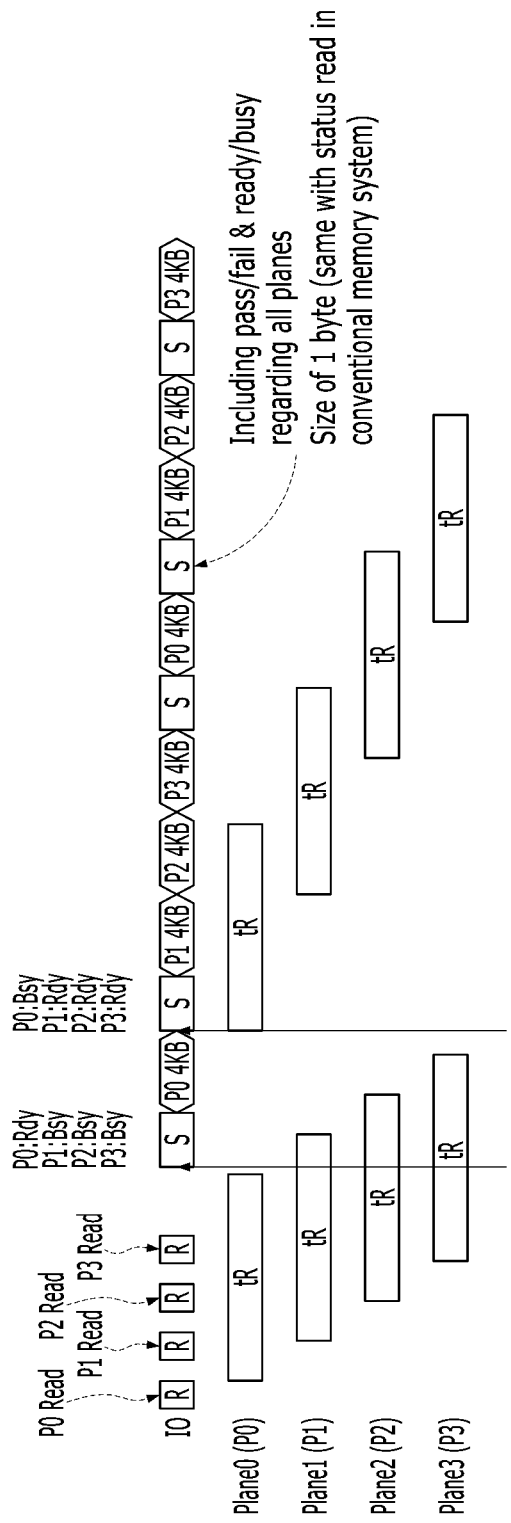
FIG. 9 illustrates a data input/output operation performed by the memory system in the interleaving mode based on the second response described with reference to FIG. 8 according to embodiments of the present disclosure.

FIG. 9 illustrates a data input/output operation performed by the memory system in the interleaving mode based on the second response described with reference to FIG. 8. In FIG. 9, similar to FIG. 7, a case in which an interleaving operation is performed on four memory planes P0 to P3 in the fourth memory die 198 is described as an example.

Referring to FIGS. 1 and 9, each of the memory planes P0 to P3 can support an interleaving mode to independently and individually perform data input/output operations. Read operations, even if individually performed within different planes in response to read commands, could have a substantially same operation margin (tR). In response to previous read commands, read operations might have been performed within each of the memory planes P0 to P3. However, each of the memory planes P0 to P3 in the fourth memory die 198 shares a data path, e.g., a channel. For example, the controller 130 may sequentially generate read commands (P0 Read, P1 Read, P2 Read, P3 Read) for reading data stored in each of the memory planes P0 to P3. The controller 130 should check whether a read operation can be performed within the respective planes P0 to P3.

Referring to FIG. 8, in response to the status check command of the controller 130, the fourth memory die 198 can return the operation status and operation result regarding all memory planes P0 to P3 included in the fourth memory die 198 through a single response transferred to the controller 130. Accordingly, the controller 130 may transmit a single status check command to the fourth memory die 198 without having to transmit the status check command to each of the planes P0 to P3. In response to the status check command, the fourth memory die 198 may transmit an operation status and an operation result of each of all the planes P0 to P3 to the controller 130.

Referring to FIG. 9, the second response corresponding to the first status check command can show that the first memory plane P0 in the fourth memory device 198 is in a standby status Rdy, but the second to fourth memory planes P1 to P3 are in a busy status Bsy. The controller 130 can transfer a read command for a read operation performed within the first memory plane P0, in response to the second response.

After transmitting the read command (P0 Read) to be performed in the first plane P0, the controller 130 can transmit a second status check command to the fourth memory die 198. The second response corresponding to the second status check command output from the fourth memory die 198 can show that the first memory plane P0 is in a busy status Bsy but the second to fourth memory planes P1 to P3 are in a standby status Rdy. The controller 130 does not have to transfer status check commands to check an operation status or an operation result regarding each of the second to fourth memory planes P1 to P3. The controller 130 can transfer read commands (P1 Read, P2 Read, P3 Read) to the fourth memory die 198 sequentially when the second to fourth memory planes P1 to P3 are ready. In response to the read commands (P1 Read, P2 Read, P3 Read), the second to fourth planes P1 to P3 in the fourth memory die 198 could perform a read operation tR individually and independently.

As described above, there is no need for the controller 130 to transfer plural status check commands to check information regarding each memory plane in the fourth memory die 198. Because inquiring that each memory plane in the fourth memory die 198 might not be required, an overlapped section between operation margins regarding data input/output operations can increase. This indicates that it takes a longer time for the plurality of memory planes to perform data I/O operations in parallel. Because the memory system 110 can perform more data I/O operations together in plural memory planes P0 to P3, data I/O performance of the memory system 110 can be improved.

As described above, the controller included in the memory system according to an embodiment of the present disclosure can check the operation status and operation result regarding a plurality of planes included in the memory die through a single query and a single response. The controller can reduce an operating margin for allocating or assigning the data input/output operations in the interleaving mode, as compared with checking the operation status and operation result regarding the plurality of planes one by one.

In addition, the memory system according to an embodiment of the present disclosure can efficiently manage resources used in a procedure of performing plural data input/output operations. The memory system can suppress unnecessary resource consumption to improve data input/output performance of the memory system.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory system, comprising:
at least one memory die including plural memory planes and a register storing operation statuses and operation results regarding the respective memory planes; and
a controller coupled to the at least one memory die via a data path and configured to transfer a first status check command to the at least one memory die and receive a first response including the operation statuses and the operation results regarding the respective memory planes,
wherein the controller is further configured to:
divide a third operation into unit operations to be performed within the respective memory planes,
transfer one of the unit operations to a first memory plane among the plural memory planes when it is determined based on the first response that the first memory plane is ready, and
transfer a second status check command to the at least one memory die when a completion regarding the transferred unit operation is transferred from any of the plural memory planes.

2. The memory system according to claim 1, wherein the first status check command includes an address indicating a memory die of the at least one memory die.

3. The memory system according to claim 1, wherein the operation statuses show whether each of the plural memory planes is busy or ready for a first operation, and
wherein the first operation includes one of a program operation, an erase operation, and a read operation.

4. The memory system according to claim 1, wherein the operation results show whether a second operation performed on each of the plural memory planes is a success or failure, and
wherein the second operation includes one of a program operation and an erase operation.

5. The memory system according to claim 1, wherein the first response has a size of 1 byte including each 2 bits assigned to each of the plural memory planes, and
wherein the 2 bits includes a first bit showing the operation state of a corresponding memory plane and a second bit showing the operation result of the corresponding memory plane.

6. The memory system according to claim 1, wherein the controller is further configured to transfer another unit operation of the unit operations to a second memory plane among the plural memory planes when it is determined based on a second response corresponding to the second status check command that the second memory plane is ready.

7. The memory system according to claim 1, wherein each of the plural memory planes includes plural memory blocks and a data input/output buffer to individually perform a data input/output operation, and
wherein the register stores the operation statuses indicating whether each of the plural memory planes is busy or ready and the operation results indicating whether an operation performed within each of the plural memory planes has succeeded or failed.

8. A memory die, comprising:
plural memory planes including plural non-volatile memory cells capable of storing data;
a register storing operation statuses and operation results regarding the respective memory planes; and
a control circuit configured to receive a status check command, collect the operation statuses and the operation results stored in the register, and output the collected operation statuses and operation results as a response corresponding to the status check command,
wherein the response comprises plural first bits showing the operation statuses regarding the respective memory planes and plural second bits showing the operation results regarding the respective memory planes.

9. The memory die according to claim 8, further comprising:
plural data input/output pins configured to transfer the status check command and the response; and
an enable pin configured to receive a chip enable signal delivered from an external device,
wherein the chip enable signal is activated before the status check command is received via the plural data input/output pins, and before the response is transferred via the plural data input/output pins.

10. The memory die according to claim 9, wherein a length of the response is an integer multiple of a number of the plural data input/output pins.

11. The memory die according to claim 9, wherein the response is outputted bit by bit through the plural data input/output pins.

12. A method for operating a memory system, comprising:
transmitting a first status check command to at least one memory die through a data path;
receiving, from the at least one memory die, a first response including operation statuses and operation results of all memory planes included in the at least one memory die, in response to the first status check command; and
transmitting a command for a data input/output operation to a plane included in the at least one memory die, in response to the first response,
wherein the method further comprises activating a chip enable signal before receiving or transferring the status check command and the first response via plural data input/output pins.

13. The method according to claim 12, further comprising storing the operation statuses and the operation results of the respective memory planes, included in at least one memory die, in a register.

14. The method according to claim 12, wherein the first status check command includes an address indicating a memory die of the at least one memory die.

15. The method according to claim 12, wherein the operation statuses show whether each of the plural memory planes is busy or ready for a first operation, and
    wherein the first operation includes one of a program operation, an erase operation, and a read operation.

16. The method according to claim 12, wherein the operation results show whether a second operation performed on each of the plural memory planes has succeeded or failed, and
    wherein the second operation is one of a program operation and an erase operation.

17. The method according to claim 12, wherein the first response has a size of 1 byte including each 2 bits assigned to each of the plural memory planes, and
    wherein the 2 bits includes a first bit showing the operation status of a corresponding memory plane and a second bit showing the operation result of the corresponding memory plane.

* * * * *